(12) United States Patent
Maki et al.

(10) Patent No.: US 7,678,999 B2
(45) Date of Patent: Mar. 16, 2010

(54) GOLD ALLOY WIRE FOR BONDING WIRE HAVING HIGH BONDING RELIABILITY, HIGH ROUNDNESS OF COMPRESSION BALL, HIGH STRAIGHTNESS AND HIGH RESIN FLOWABILITY RESISTANCE

(75) Inventors: Kazunari Maki, Naka-gun (JP); Yuji Nakata, Sanda (JP)

(73) Assignee: Tanaka Denshi Kogyo K.K., Tokyo (JP)

( * ) Notice: Subject to any disclaimer, the term of this patent is extended or adjusted under 35 U.S.C. 154(b) by 0 days.

(21) Appl. No.: 11/917,241

(22) PCT Filed: Jun. 8, 2006

(86) PCT No.: PCT/JP2006/311523

§ 371 (c)(1),
(2), (4) Date: Jul. 18, 2008

(87) PCT Pub. No.: WO2006/134823

PCT Pub. Date: Dec. 21, 2006

(65) Prior Publication Data

US 2009/0120665 A1 May 14, 2009

(30) Foreign Application Priority Data

Jun. 14, 2005 (JP) ............... 2005-173724

(51) Int. Cl.
*H01B 5/00* (2006.01)
(52) U.S. Cl. .................................. 174/126.1
(58) Field of Classification Search .............. 174/36, 174/126.1, 126.2; 427/63, 366, 250, 125
See application file for complete search history.

(56) References Cited

U.S. PATENT DOCUMENTS

| | | | | |
|---|---|---|---|---|
| 5,283,232 A | * | 2/1994 | Kohno et al. | 505/431 |
| 2008/0050267 A1 | * | 2/2008 | Murai et al. | 420/508 |

FOREIGN PATENT DOCUMENTS

| | | |
|---|---|---|
| JP | 06112251 | 4/1994 |
| JP | 8109425 | 4/1996 |
| JP | 10275820 | 10/1998 |
| JP | 11045899 | 2/1999 |
| JP | 11045900 | 2/1999 |
| JP | 11045901 | 2/1999 |
| JP | 11-214425 A * | 8/1999 |

* cited by examiner

Primary Examiner—William H Mayo, III
(74) Attorney, Agent, or Firm—Darby & Darby P.C.

(57) ABSTRACT

A gold alloy wire for a bonding wire contains one kind or two kinds of Pt and Pd of 5000 ppm to 2% by mass in total, Ir: 1 to 200 ppm, Ca: 20 to 200 ppm, Eu: 10 to 200 ppm, Be: 0.1 to 30 ppm, if necessary, and La: 10 to 200 ppm, if necessary. At least two kinds of Ca, Eu, Be, and La are in a range of 50 to 250 ppm in total.

7 Claims, No Drawings

GOLD ALLOY WIRE FOR BONDING WIRE HAVING HIGH BONDING RELIABILITY, HIGH ROUNDNESS OF COMPRESSION BALL, HIGH STRAIGHTNESS AND HIGH RESIN FLOWABILITY RESISTANCE

CROSS-REFERENCE TO PRIOR APPLICATION

This is a U.S. National Phase Application under 35 U.S.C. §371 of International Patent Application No. PCT/JP2006/311523 filed Jun. 8, 2006, which claims the benefit of Japanese Patent Application No. 2005-173724 filed Jun. 14, 2005, which is incorporated by reference herein. The International Application was published on Dec. 21, 2006 as WO 2006/134823 A1 under PCT Article 21(2).

TECHNICAL FIELD

The present invention relates to a gold alloy wire for a bonding wire having high bonding reliability, high roundness of a compression ball, high straightness, and high resin flowability resistance for connecting a chip electrode of semiconductor devices such as a transistor, an LSI, or an IC which can be used under a high-temperature environment, for example, the high-temperature environment in the vicinity of an automobile engine in which the temperature becomes as high as 100 to 160° C. to an exterior lead part, and in particular, relates to a gold alloy wire for a bonding wire which can be used under a high-temperature environment and has a fine wire diameter of less than 20 μm.

BACKGROUND ART

Recently, semiconductor devices such as a transistor, an LSI, or an IC are used under a high-temperature environment, for example, in the vicinity of an engine, and an operating temperature of a high frequency IC tends to be increasingly high. Therefore, even though the semiconductor devices are exposed to the high-temperature environment, a high degree of reliability is required.

As a gold alloy wire for a bonding wire for connecting an electrode on an IC chip which is used under the high-temperature environment to an exterior lead part, a gold alloy wire for a bonding wire (see Japanese Unexamined Patent Application, First Publication No. Hei 06-112251 ("JP '251")) having a component composition comprising at least one kind of Pd, Pt, Rh, Ir, Os, and Ru of 1000 ppm to 5% by mass in total, at least one kind of Ca, Be, Ge, Si, Fe, Y, and rare earth elements of 1 to 50 ppm in total, and the balance being Au and inevitable impurities has been known. The gold alloy wire for the bonding wire as described above contains a large amount of platinum group metals to improve bonding strength of a compression ball and an Al pad at a high temperature, and further contains Ca, Be, or the like to increase hardness and improve stability of a loop. Generally, in order to connect the electrode on the IC chip to the exterior lead part by using the gold alloy wire for the bonding wire, a method of bonding the gold alloy wire by an ultrasonic wave-combined thermal compression has been mainly used.

SUMMARY OF THE INVENTION

Recently, as the integration of the semiconductor devices increases, an area of Al pad becomes small, and the decrease of bonding strength due to a ball bonding or the occurrence of bonding failure due to a raising of electrical resistance at the bonding interface has been problems in an automobile IC for requiring high reliability and high frequency IC in which the operating temperature increases in a high-temperature environment. Since the bonding failure is likely to occur gradually due to the deterioration of bonding conditions such as a shrinking of the bonding areas, it is required to ensure the higher bonding reliability (persistence of the bonding strength or electrical resistance due to the ball bonding at the bonding interface under some environments) than that of the related art.

In addition, the roundness of the compression balls is low in bonding the ball, a portion of the compression balls are protruded from the Al pad, and a short failure occurs by the contact of a neighboring compression ball. As a result, the short failure is likely to increase by the shrinking of the Al pad area and a bonding pad pitch. Therefore, it is required that the roundness of the compression ball is higher than that of the related art compression ball.

Furthermore, at the same time the length of a wire loop (hereinafter, referred to as a loop length) for connecting the chip electrodes of the semiconductor devices to the outer lead becomes long, the distance between the wire loop and a neighboring loop parallel to the wire loop becomes narrow. In order to cope with the above-described states, it tends to increasingly thin the diameter of the gold alloy wire using as a bonding wire. However, when the gold alloy wire having a rolled thin diameter is extracted from a spool, a curling or meandering (curvature or bending) may easily occur in the gold alloy wire. When bonding is conducted by using the gold alloy wire in which curling or meandering (curvature or bending) exists, since the neighboring bonding wire contacts, a bad semiconductor chips are produced, and thus the yield ratio is reduced. More particularly, when the diameter of the bonding wire made of the gold alloy is less than 20 μm, curling or meandering (curvature or bending) may easily occur in the wire directly after being unreeled from the spool. The loop formed by the bonding without the occurrence of curling or meandering (curvature or bending) in the wire directly after being unreeled from the spool does not contact to the neighboring loop. The above-described property is referred to as the straightness. When straightness is insufficient, since the loop contacts to the neighboring loop and causes a short, the bad semiconductor devices are produced to reduce the yield ratio.

In addition, the loop is formed by bonding the wire, and then being molded by the resin. However, at this time, when the bonding wire is influenced by the resin, since the bonding wire contacts to the neighboring loop and causes the short, the bad semiconductor devices are produced to reduce the yield ratio is reduced. With respect to the resin flow, when the diameter of the related art gold alloy wire for the bonding wire is 25 μm or 30 μm, the resin flow is hardly problem.

However, as the high integration of the semiconductor devices increases, the distance of the chip electrodes of the semiconductor devices becomes narrow. In order to cope with the high integration of the semiconductor devices, the bonding is performed by using the wire having a thin diameter. However, when the wire diameter is less than 20 μm, the loop is easily influenced during the molding of the resin. Accordingly, it is necessary to have the property (hereinafter, referred to as a resin flowability resistance) in which resin flow is difficult to produce, even though the wire has a thin diameter.

As described above, the gold alloy wire for the bonding wire described in JP '251 is not sufficiently response to the rigorous request of the recent years. The object of the present invention can satisfy the above-described request and is to provide a gold alloy wire for an excellent bonding wire having higher bonding reliability, higher roundness of a compression ball, higher straightness, and higher resin flowability resistance.

The inventors have done research so as to develop a gold alloy wire for a bonding wire having high bonding reliability, high roundness of a compression ball, high straightness, and high resin flowability resistance. The results obtained by the research are as follows:

(A) A gold alloy wire has a composition including one kind or two kinds of Pt and Pd of 5000 ppm to 2% by mass in total, Ir: 1 to 200 ppm, Ca: 20 to 200 ppm, and Eu: 10 to 200 ppm in a high-purity gold having purity of 99.999% by mass. The above gold alloy wire has high bonding reliability, high roundness of a compression ball, high straightness, and high resin flowability resistance under a high-temperature environment in the vicinity of an automobile engine, even though conductivity thereof becomes somewhat poor.

(B) The gold alloy wire having the composition described in (A) further having Be: 0.1 to 30 ppm. Since Be distorts a crystal lattice of Au so as to increase the mechanical strength of the gold alloy wire for the bonding wire, lower a re-crystallizing temperature, and raise the height of loop to realize the proper height of loop, Be is added according to need.

(C) The gold alloy wire having the composition described in (A) further including La: 10 to 200 ppm. Since La increases the mechanical strength of the gold alloy wire for the bonding wire while raising the re-crystallizing temperature, and lowers the height of loop of the gold alloy wire, La is added according to need.

(D) The total amount of Ca, Eu, Be, and La is in a range of 50 to 250 ppm.

(E) Even though Ag: 1 to 20 ppm is contained in the gold alloy wire described in (A) to (D) having high bonding reliability, high roundness of a compression ball, high straightness, and high resin flowability resistance, it has little influence on the properties.

The invention based on the above-described research results is as follows:

(1) A gold alloy wire for a bonding wire having high bonding reliability, high roundness of a compression ball, high straightness, and high resin flowability resistance has a component composition having one kind or two kinds of Pt and Pd of 5000 ppm to 2% by mass in total, Ir: 1 to 200 ppm, Ca: 20 to 200 ppm, Eu: 10 to 200 ppm, and the balance being Au and inevitable impurities.

(2) A gold alloy wire for a bonding wire having high bonding reliability, high roundness of a compression ball, high straightness, and high resin flowability resistance has a component composition including one kind or two kinds of Pt and Pd of 5000 ppm to 2% by mass in total, Ir: 1 to 200 ppm, Ca: 20 to 200 ppm, Eu: 10 to 200 ppm, Be: 0.1 to 30 ppm, and the balance being Au and inevitable impurities.

(3) A gold alloy wire for a bonding wire having high bonding reliability, high roundness of a compression ball, high straightness, and high resin flowability resistance has a component composition having one kind or two kinds of Pt and Pd of 5000 ppm to 2% by mass, Ir: 1 to 200 ppm, Ca: 20 to 200 ppm, Eu: 10 to 200 ppm, La: 10 to 200 ppm, and the balance being Au and inevitable impurities.

(4) A gold alloy wire for a bonding wire having high bonding reliability, high roundness of a compression ball, high straightness, and high resin flowability resistance has a component composition including one kind or two kinds of Pt and Pd of 5000 ppm to 2% by mass in total, Ir: 1 to 200 ppm, Ca: 20 to 200 ppm, Eu: 10 to 200 ppm, Be: 0.1 to 30 ppm, La: 10 to 200 ppm, and the balance being Au and inevitable impurities.

(5) The gold alloy wire for the bonding wire having high bonding reliability, high roundness of the compression ball, high straightness, and high resin flowability resistance according to any one of (1) to (4), at least one kind or two kinds of Ca, Eu, Be, and La may be in a range of 50 to 250 ppm in total.

(6) The gold alloy wire for the bonding wire having high bonding reliability, high roundness of the compression ball, high straightness, and high resin flowability resistance according to any one of (1) to (5) may further comprise Ag: 1 to 20 ppm.

In a method of manufacturing a gold alloy wire for a bonding wire for annealing gold alloy wire materials obtained by conducting a drawing process the gold alloy wire materials having the component compositions described in (1) to (6) so as to have a predetermined diameter, when defines 0.2% proof strength (Pa) of the gold alloy wire for the bonding wire as $\sigma_{0.2}$, Young's modulus (Pa) as E, and fracture elongation percentage as $E_L$, it may obtain the gold alloy wire for a bonding wire satisfying the following equations under an annealing temperature of 550° C. or less which is lower than the related art annealing temperature:

$E \leqq 75$ GPa, $(\sigma_{0.2}/E) \geqq 2.2 \times 10^{-3}$, and $2\% \leqq E_L \leqq 10\%$ A reduction ratio by one die during the drawing process may be 5% or less, which is lower than the related art reduction ratio. The gold alloy wire for the bonding wire for satisfying the above-described conditions has higher straightness and higher resin flowability resistance.

Accordingly, (7) The gold alloy wire for the bonding wire having high bonding reliability, high roundness of the compression ball, high straightness, and high resin flowability resistance according to any one of (1) to (6), when 0.2% proof strength (Pa) of the gold alloy wire for a bonding wire is $\sigma_{0.2}$, Young's modulus (Pa) is E, and fracture elongation percentage is $E_L$, the following equations are satisfied:

$E \geqq 75$ GPa, $(\sigma_{0.2}/E) \geqq 2.2 \times 10^{-3}$, and $2\% \leqq E_L \leqq 10\%$ Hereinafter, the reason why the component composition of the gold alloy wire for the bonding wire according to the invention having high bonding reliability, high roundness of a compression ball, high straightness, and high resin flowability resistance is limited, as described above, will be explained.

[I] Component Composition (a) Pt and Pd:

Both Pt and Pd, which form a complete solid solubility with Au, cause the deterioration of the bonding strength of the compression ball and Al pad to inhibit and improve the bonding reliability. The layered-shape phase including Pt or Pd is formed in the vicinity of a bonding interface to act as a layer (so called, barrier layer with respect to Au diffusion) for decreasing a diffusion velocity of Au, thereby inhibiting the generating velocity of voids generating in the bonding part in accordance with the diffusion of Au. Accordingly, it is considered that Pt and Pd inhibit the deterioration of the bonding strength of the compression ball and Al pad and improve the bonding reliability. As the amount of Pt or Pd is rich, the effect for inhibiting (improving the bonding reliability) the deterioration of the bonding strength grows higher. However, when the total amount of one kind or two kinds of Pt and Pd is less than 5000 ppm, the effect for inhibiting the deterioration of the bonding strength is limited, while, when the total amount of one kind or two kinds of Pt and Pd is greater than 2% by mass, the hardness of the ball becomes excessively high, thus causing IC chips to crack or impair during the bonding. For this reason, it is not preferable that the total amount of one kind or two kinds of Pt and Pd be less than 5000 ppm or greater than 2% by mass. Accordingly, the total amount of one kind or two kinds of Pt and Pd is set within a range of 5000 ppm to 2% by mass.

(b) Ir:

Ir inhibits the growth of grains (coarsening of grains). For this reason, when forming a free-air ball, it prevents the grain of a wire part (heat-affected part) directly on the ball from being coarsened due to the effect of heat on the ball, and the solidified free-air ball is formed from a great number of fine grains. In addition, the compression ball evenly extends in a radial pattern, thereby improving the roundness of the compression ball. However, when the amount of Ir is less than 1 ppm, it may not obtain a predetermined effect. Meanwhile, when the amount of Ir is greater than 200 ppm in the gold alloy wire for the bonding wire containing one kind or two kinds of Pt and Pd of 5000 ppm to 2% by mass in total, the effects are saturated and is not apparently improved, and the hardness of the ball becomes excessively high, thus causing IC chips to destruct or impair. For this reason, it is not preferable that the amount of Ir be less than 1 ppm or greater than 200 ppm. Accordingly, the amount of Ir is set within the range of 1 ppm to 200 ppm.

(c) Ca:

Ca which serves as an alkali earth metal and has the metal bond radius larger than that of Au distorts the crystal lattice of Au, thereby increasing the mechanical strength of the gold alloy wire for the bonding wire and work hardening ability of the free-air ball, raising the re-crystallizing temperature, and lowering the height of loop of the gold alloy wire. However, when the amount of Ca is less than 20 ppm, since the strength is reduced, it is difficult to satisfy the conditions of $E \geq 75$ GPa, $(\sigma_{0.2}/E) \geq 2.2 \times 10^{-3}$, and $2\% \leq E_L \leq 10\%$. Therefore, the straightness and resin flowability resistance are reduced. Meanwhile, when the amount of Ca is greater than 200 ppm, the hardness of the ball of the gold alloy wire for the bonding wire containing one kind or two kinds of Pt and Pd of 5000 ppm to 2% by mass in total becomes high, thus causing IC chips to crack or impair. In addition, in this case, a number of oxides are generated in the surface of free-air ball during the bonding of balls, and large shrinkage holes, which do not contribute to the bonding, are formed at the bottom-center of the free-air ball. For this reason, it is not preferable that the amount of Ca be less than 20 ppm or greater than 200 ppm. Accordingly, the amount of Ca is set within the range of 20 ppm to 200 ppm.

(d) Eu:

Eu which serves as a rare earth metal and has the metal bond radius larger than that of Au distorts the crystal lattice of Au, thereby increasing the mechanical strength of the gold alloy wire for the bonding wire and the work hardening ability of free-air ball, raising the re-crystallizing temperature, and lowering the height of loop of the gold alloy wire. However, when the amount of Eu is less than 10 ppm, since the strength is reduced, it is difficult to satisfy the conditions of $E \geq 75$ GPa, $(\sigma_{0.2}/E) \geq 2.2 \times 10^{-3}$, and $2\% \leq E_L \leq 10\%$. Therefore, the straightness and resin flowability resistance are reduced. Meanwhile, when the amount of Eu is greater than 200 ppm, the hardness of ball of the gold alloy wire for the bonding wire containing one kind or two kinds of Pt and Pd of 5000 ppm to 2% by mass in total becomes high, thus causing IC chips to crack or impair. In addition, in this case, a quantity of oxides is generated in the surface of free-air ball during the bonding of balls, and large shrinkage holes, which do not contribute to the bonding, are formed at the bottom-center of the free-air ball. For this reason, it is not preferable that the amount of Eu be less than 10 ppm and greater than 200 ppm. Accordingly, the amount of Eu is set within the range of 10 ppm to 200 ppm.

(e) Be:

Be has the metal bond radius smaller than that of Au and distorts the crystal lattice of Au, thereby increasing the mechanical strength of the gold alloy wire for the bonding wire and the work hardening ability of free-air ball. In a case of containing Be together with Ca and Eu, since the re-crystallizing temperature lowers and the height of loop rises to realize the proper height of loop, it is possible to add according to need. However, when the amount of Be is less than 0.1 ppm, it may not obtain a predetermined effect. Meanwhile, when the amount of Be is greater than 30 ppm, the hardness of ball of the gold alloy wire for the bonding wire containing one kind or two kinds of Pt and Pd of 5000 ppm to 2% by mass in total becomes high, thus causing IC chips to crack or impair. In addition, in this case, a quantity of oxides is generated in the surface of free-air ball during the bonding of the balls, large shrinkage holes, which do not contribute to the bonding, are formed at the bottom-center of the free-air ball, and the size of grains of the directly upper part of ball and the ball part increases, thus deteriorating the roundness of the compression ball part. For this reason, it is not preferable that the amount of Be be less than 0.1 ppm and greater than 30 ppm. Accordingly, the amount of Be is set within the range of 0.1 ppm to 30 ppm.

(f) La:

La is added according to need in order to increase the mechanical strength of the gold alloy wire for the bonding wire and the work hardening ability of the free-air ball, raise the re-crystallizing temperature, and lower the height of the loop of the gold alloy wire. However, when the amount of La is less than 10 ppm, it may not obtain a predetermined effect. Meanwhile, when the amount of La is greater than 200 ppm, the hardness of the ball of the gold alloy wire for the bonding wire containing one kind or two kinds of Pt and Pd of 5000 ppm to 2% by mass in total becomes high, thus causing IC chips to crack or impair. In addition, in this case, a number of oxides are generated in the surface of free-air ball during the bonding of the balls, and large shrinkage holes, which do not contribute to the bonding, are formed at the bottom-center of the free-air ball. For this reason, it is not preferable that the amount of La be less than 10 ppm or greater than 200 ppm. Accordingly, the amount of La is set within the range of 10 ppm to 200 ppm.

(g) $50 \leq Ca+Eu+Be+La \leq 250$

In the gold alloy wire for the bonding wire containing one kind or two kinds of Pt and Pd of 5000 ppm to 2% by mass in total, it is preferable that the total amount of Ca, Eu, Be, and La is in the range of 50 to 250 ppm. The reason is that, when the total amount of Ca, Eu, Be, and La is less than 50 ppm, the strength is reduced, and thus it is difficult to realize the conditions of $E \geq 75$ GPa, $(\sigma_{0.2}/E) \geq 2.2 \times 10^{-3}$, and $2\% \leq E_L \leq 10\%$, resulting in deteriorating the straightness and resin flowability resistance. In addition, the reason is that, when the total amount of Ca, Eu, Be, and La is greater than 250 ppm, the hardness of ball of the gold alloy wire for the bonding wire containing one kind or two kinds of Pt and Pd in the total amount of 5000 ppm to 2% by mass becomes high, thus causing IC chips to crack or impair. In addition, in this case, a number of oxides are generated in the surface of free-air ball during the bonding of the balls, and large shrinkage holes, which do not contribute to the bonding, are formed at the bottom-center of the free-air ball.

Ag:

Even though Ag of 1 to 20 ppm is contained, it has little influence on the properties. Accordingly, Ag is added according to need. However, when Ag exceeds 20 ppm, the bondability of a stitching bond in a low ultrasonic output is reduced and the exfoliation of the stitching bond is not generated. Therefore, it is not preferable that the amount of Ag is over 20 ppm.

[II] Mechanical Property

All of the gold alloy wires for the bonding wire containing the above-described component composition have high bonding reliability, high roundness of a compression ball, high straightness, and high resin flowability resistance. However, when manufacturing the gold alloy wire for the bonding wire so as to satisfy the conditions of $E \geqq 75$ GPa, $(\sigma_{0.2}/E) \geqq 2.2 \times 10^{-3}$, and $2\% \leqq E_L \leqq 10\%$ by defining 0.2% proof strength (Pa) of the gold alloy wire as $\sigma_{0.2}$, Young's modulus (Pa) as E, and fracture elongation percentage as $E_L$, all of the gold alloy wires for the bonding wire containing the above-described component composition have higher bonding reliability, higher roundness of a compression ball, higher straightness, and higher resin flowability resistance.

The reason is as follows:

In case of E<75 GPa, that is, when Young's modulus (Pa) is low, the bonded gold alloy wire largely flows by the resin (that is, the resin flow is large) during molding after the wire bonding, thereby the contact frequency and short frequency of the gold alloy wires adjacent to each other are increased. Therefore, the yield ratio of semiconductor chips is reduced. When $\sigma_{0.2}/E$ is more than $2.2 \times 10^{-3}$, the straightness rapidly is improved, and when the fracture elongation percentage is less than 2%, the residual distortion of the gold alloy wire after drawing the wire resides after annealing, resulting in reducing the straightness. In addition, when the fracture elongation percentage is higher than 10%, most of the conditions of E<75 GPa and $(\sigma_{0.2}/E) < 2.2 \times 10^{-3}$ is satisfied. Therefore, either the straightness is reduced or the resin flow is improved.

According to the invention, the fracture elongation percentage $E_L$ (%), the 0.2% proof strength $\sigma_{0.2}$ (Pa), and the Young's modulus E (Pa) of the gold alloy wire for the bonding wire are measured by tensioning the gold alloy wire up to be fractured by a tension tester in the conditions of the distance between gauge points: 100 mm and a tension velocity: 10 mm/minute at a room temperature.

Here, strain and tension stress are defined as follows. Strain=the elongation (mm) of the gold alloy wire for the bonding wire/100 mm, and tension stress=tension load (N)/initial sectional area (m$^2$) of the gold alloy wire for the bonding wire. In addition, the fracture elongation percentage $E_L$ (%), the 0.2% proof strength $\sigma_{0.2}$ (Pa), and the Young's modulus E (Pa) are defined as follows. The fracture elongation percentage $E_L$ (%)=strain when the gold alloy wire is fractured×100=[elongation (mm) when the gold alloy wire is fractured/100 (mm)]×100. The 0.2% proof strength $\sigma_{0.2}$ (Pa): tension stress (Pa) in applying a permanent deformation of 0.2% to the gold alloy wire for the bonding wire. In addition, the Young's modulus E (Pa): the ratio of tension stress and strain, that is, tension stress (Pa)/strain, in the range where tension stress and strain are in direct proportion.

As described above, the gold alloy wire for the bonding wire is excellent in high bonding reliability, high roundness of a compression ball, high straightness, and high resin flowability resistance. In addition, the yield ratio of the semiconductor devices can be improved by performing the bonding by using the gold alloy wire. Accordingly, the gold alloy wire for the bonding wire according to the invention has especially excellent effects in an industry.

DETAILED DESCRIPTION OF THE INVENTION

A gold alloy wire having a wire diameter: 19 µm was manufactured by a drawing process a gold alloy wire material having a wire diameter: 50 µm and having component compositions indicated in Tables 1 to 3 at a reduction ratio of 4.8%. Further, gold alloy wires for a bonding wire according to the invention (hereinafter, referred to as wires according to the invention) 1 to 27, comparative gold alloy wires for a bonding wire (hereinafter, referred to as comparative wires) 1 to 19, and the related art gold alloy wire for a bonding wire (hereinafter, referred to as the related art wire) 1 were manufactured by annealing the gold alloy wire at temperature indicated in Tables 4 to 6, and taken-out by an immediate spool of radius: 50 mm. Here, in the annealing and winding process, the radii of all of sheaves (pulleys) using for changing paths of the wires are 9 mm. A fracture elongation percentage $E_L$, Young's modulus (Pa) E, and 0.2% proof strength (Pa) $\sigma_{0.2}$ were measured by winding by a spool having a radius of 25 mm by 2000 m the wire taken-out by the immediate spool and removing the tip of the wire by 15 m, and $\sigma_{0.2}/E$ was calculated. The results were indicated in Tables 4 to 6. The number of samples is five in each of the measurement, thereby obtaining an average value.

The wires 1 to 27 according to the invention, the comparative wires 1 to 19, and the related art wire 1 having the component compositions indicated in Tables 1 to 3 and the mechanical properties indicated in Tables 4 to 6 were set in wire bond (maxam plus) manufactured by Kulicke & Soffa, and the bonding was performed on the substrate in which IC chips of the semiconductor were mounted under the conditions of heating temperature: 150° C., the length of loop: 5 mm, the height of loop: 220 µm, the diameter of a compression ball: 34 µm, and the height of the compression ball: 8 µm. The straightness, roundness of the compression ball, bonding reliability, and presence or absence of the damage of Al pad with respect to the wires 1 to 27 according to the invention, the comparative wires 1 to 19, and the related art wire 1 were estimated by following measurements.

Straightness Estimation:

10000 loops were manufactured at a pad pitch distance of 45 µm with respect to each of the samples, and the number (contacting number) of places for contacting between the neighboring loops was measured. Accordingly, the straightness was estimated by indicating the results in Tables 4 to 6.

Compression Ball Roundness Estimation:

By observing 100 compression balls with respect to each of the samples, when all of them are good, it indicates as "○", and even though one bad exists, it indicates as "x". Accordingly, the roundness was estimated by indicating the results in Tables 4 to 6.

Bonding Reliability Estimation:

After holding for 1000 hours in air of 200° C., 100 proof tests with respect to each sample were conducted by hanging a tool on a bending part (kink) of the loop directly on the compression ball. The fracture in the proof tests is referred to as a fracture (ball lift) in the bonding interface of the compression ball and Al pad. By observing the compression balls, when all the fractures were occurred in a neck, it was estimated as "○", and even though one ball lift exists, it was estimated as "x".

Presence or Absence of Damages of Al Pad:

By observing 100 compression balls with respect to each of the samples, the presence or absence of damages of Al pad was invested. When the damages of Al pad did not find, it was estimated as "○", and even though one damage was found, it was estimated as "x". Further, the height of loop and the resin flowability resistance with respect to the wires 1 to 27 according to the invention, the comparative wires 1 to 19, and the related art wire 1 were estimated.

Height of Loop:

The wires 1 to 27 according to the invention, the comparative wires 1 to 19, and the related art wire 1 having the component compositions indicated in Tables 1 to 3 and the mechanical properties indicated in Tables 4 to 6 were set in the wire bond (maxam plus) manufactured by Kulicke & Soffa, and the looping were mounted was performed under the conditions of the diameter of the compression ball: 34 μm, the height of the compression ball: 8 μm, and the length of loop: 1 mm without doing not reverse. The highest part of the loop and the height of the area of Al pad were measured by a light microscope, and the difference of the highest part of the loop and the height of the area of Al pad was obtained as the height of loop. Accordingly, the height of loop was estimated by indicating the results in Tables 4 to 6.

Resin Flowability Resistance:

After sealing with an epoxy resin the substrate in which the bonded IC chips of the semiconductor were mounted under the condition of the length of loop: 3.5 mm by using a molding apparatus, the inside of the semiconductor chip was X-ray projected by using a soft X-ray non-destruction inspection system and the flowing rates where the maximum portion of the wire flow were measured at 20 times. By dividing the average value of the measured flow rates by the length of loop, the obtained value (%) was defined as a resin flow, and the resin flow was measured. Accordingly, the resin flowability resistance was estimated by indicating the results in Tables 4 to 6.

TABLE 1

| Wire | | Pt | Pd | Ir | Ca | Be | Eu | La | Ag | Au | Ca + Eu + Be + La |
|---|---|---|---|---|---|---|---|---|---|---|---|
| The present invention | 1 | 5000 | — | 50 | 60 | 10 | 50 | — | — | Balance | 120 |
| | 2 | 10000 | — | 50 | 60 | 10 | 50 | — | — | Balance | 120 |
| | 3 | 20000 | — | 50 | 60 | 10 | 50 | — | — | Balance | 120 |
| | 4 | — | 5000 | 50 | 60 | 10 | 50 | — | — | Balance | 120 |
| | 5 | — | 10000 | 50 | 60 | 10 | 50 | — | — | Balance | 120 |
| | 6 | — | 20000 | 50 | 60 | 10 | 50 | — | — | Balance | 120 |
| | 7 | 2500 | 2500 | 50 | 60 | 10 | 50 | — | — | Balance | 120 |
| | 8 | 5000 | 5000 | 50 | 60 | 10 | 50 | — | — | Balance | 120 |
| | 9 | 10000 | 10000 | 50 | 60 | 10 | 50 | — | — | Balance | 120 |
| | 10 | 5000 | 5000 | 1 | 60 | 10 | 50 | — | — | Balance | 120 |
| | 11 | 5000 | 5000 | 200 | 60 | 10 | 50 | — | — | Balance | 120 |
| | 12 | 5000 | 5000 | 50 | 20 | 10 | 50 | — | — | Balance | 80 |
| | 13 | 5000 | 5000 | 50 | 200 | 10 | 40 | — | — | Balance | 250 |
| | 14 | 5000 | 5000 | 50 | 60 | — | 50 | — | — | Balance | 110 |
| | 15 | 5000 | 5000 | 50 | 60 | 30 | 50 | — | — | Balance | 140 |
| | 16 | 5000 | 5000 | 50 | 60 | 10 | 10 | — | — | Balance | 80 |
| | 17 | 5000 | 5000 | 50 | 40 | 10 | 200 | — | — | Balance | 250 |
| | 18 | 5000 | 5000 | 50 | 60 | 10 | 50 | 10 | — | Balance | 130 |
| | 19 | 5000 | 5000 | 50 | 60 | 10 | 50 | 50 | — | Balance | 170 |
| | 20 | 5000 | 5000 | 50 | 30 | — | 20 | 200 | — | Balance | 250 |

TABLE 2

| Wire | | Pt | Pd | Ir | Ca | Be | Eu | La | Ag | Au | Ca + Eu + Be + La |
|---|---|---|---|---|---|---|---|---|---|---|---|
| The present invention | 21 | 5000 | 5000 | 50 | 60 | 10 | 50 | — | — | Balance | 120 |
| | 22 | 5000 | 5000 | 50 | 60 | 10 | 50 | — | 5 | Balance | 120 |
| | 23 | 5000 | 5000 | 50 | 60 | 10 | 50 | — | 20 | Balance | 120 |
| | 24 | 5000 | 5000 | 50 | 30 | — | 20 | — | — | Balance | 50 |
| | 25 | 5000 | 5000 | 50 | 80 | 10 | 80 | 80 | — | Balance | 250 |
| | 26 | 5000 | 5000 | 50 | 60 | 10 | 50 | — | — | Balance | 120 |
| | 27 | 5000 | 5000 | 50 | 60 | 10 | 50 | — | — | Balance | 120 |
| Comparative | 1 | 3000* | — | 50 | 60 | 10 | 50 | — | — | Balance | 120 |
| | 2 | 30000* | — | 50 | 60 | 10 | 50 | — | — | Balance | 120 |
| | 3 | — | 3000* | 50 | 60 | 10 | 50 | — | — | Balance | 120 |
| | 4 | — | 30000* | 50 | 60 | 10 | 50 | — | — | Balance | 120 |
| | 5 | 1500* | 1500* | 50 | 60 | 10 | 50 | — | — | Balance | 120 |
| | 6 | 15000* | 15000* | 50 | 60 | 10 | 50 | — | — | Balance | 120 |
| | 7 | 5000 | 5000 | —* | 60 | 10 | 50 | — | — | Balance | 120 |
| | 8 | 5000 | 5000 | 300* | 60 | 10 | 50 | — | — | Balance | 120 |
| | 9 | 5000 | 5000 | 50 | 10* | 10 | 50 | — | — | Balance | 70 |
| | 10 | 5000 | 5000 | 50 | 220* | 10 | 20 | — | — | Balance | 250 |
| | 11 | 5000 | 5000 | 50 | 60 | 40* | 50 | — | — | Balance | 150 |
| | 12 | 5000 | 5000 | 50 | 60 | 10 | 4* | — | — | Balance | 74 |

*means a value out of the range of the present invention

TABLE 3

| | | Component Composition of Gold Alloy Wire (Mass ppm) | | | | | | | | | |
|---|---|---|---|---|---|---|---|---|---|---|---|
| Wire | | Pt | Pd | Ir | Ca | Be | Eu | La | Ag | Au | Ca + Eu + Be + La |
| Comparative | 13 | 5000 | 5000 | 50 | 30 | — | 220* | — | — | Balance | 250 |
| | 14 | 5000 | 5000 | 50 | 20 | — | 10 | 220* | — | Balance | 250 |
| | 15 | 5000 | 5000 | 50 | 60 | 10 | 50 | — | 100* | Balance | 120 |
| | 16 | 5000 | 5000 | 50 | 20 | — | 10 | — | — | Balance | 30* |
| | 17 | 5000 | 5000 | 50 | 90 | 15 | 90 | 90 | — | Balance | 285* |
| | 18 | 5000 | 5000 | 50 | 60 | 10 | 50 | — | — | Balance | 120 |
| | 19 | 5000 | 5000 | 50 | 60 | 10 | 50 | — | — | Balance | 120 |
| The Related Art 1 | | 5000 | 5000 | 50 | 20 | 10 | Y: 20 | — | — | — | — |

*means a value out of the range of the present invention

TABLE 4

| | | | Mechanical Property | | | | The | Roundness | | | Height | State |
|---|---|---|---|---|---|---|---|---|---|---|---|---|
| Wire | | Annealing Temperature (°C.) | Fracture Elongation Percentage $E_L$ (%) | Young's modulus E (GPa) | $\sigma_{0.2}/E \times 10^{-5}$ | $\sigma_{0.2}$ (MPa) | number of contacts (Piece) | of Compression Ball | Bonding Reliability | Resin Flow (%) | of Loop (μm) | of Al pad |
| The present invention | 1 | 520 | 4.1 | 90 | 2.4 | 220 | 20 | ○ | ○ | 2.3 | 71 | ○ |
| | 2 | 520 | 4.0 | 88 | 2.5 | 224 | 16 | ○ | ○ | 2.2 | 74 | ○ |
| | 3 | 521 | 4.0 | 93 | 2.5 | 234 | 23 | ○ | ○ | 2.2 | 75 | ○ |
| | 4 | 520 | 4.3 | 88 | 2.5 | 217 | 20 | ○ | ○ | 2.2 | 73 | ○ |
| | 5 | 520 | 4.0 | 90 | 2.4 | 220 | 15 | ○ | ○ | 2.4 | 73 | ○ |
| | 6 | 519 | 4.1 | 93 | 2.4 | 227 | 16 | ○ | ○ | 2.1 | 71 | ○ |
| | 7 | 519 | 4.1 | 89 | 2.4 | 216 | 16 | ○ | ○ | 2.4 | 72 | ○ |
| | 8 | 521 | 4.3 | 92 | 2.4 | 221 | 21 | ○ | ○ | 2.1 | 74 | ○ |
| | 9 | 522 | 4.3 | 90 | 2.6 | 234 | 18 | ○ | ○ | 2.3 | 74 | ○ |
| | 10 | 522 | 4.2 | 90 | 2.6 | 229 | 20 | ○ | ○ | 2.5 | 79 | ○ |
| | 11 | 522 | 4.2 | 90 | 2.5 | 228 | 15 | ○ | ○ | 2.2 | 75 | ○ |
| | 12 | 510 | 4.3 | 73 | 2.3 | 179 | 30 | ○ | ○ | 3.0 | 77 | ○ |
| | 13 | 545 | 4.4 | 95 | 2.9 | 271 | 8 | ○ | ○ | 1.8 | 63 | ○ |
| | 14 | 531 | 4.3 | 83 | 2.5 | 221 | 16 | ○ | ○ | 2.7 | 63 | ○ |
| | 15 | 508 | 4.4 | 93 | 2.9 | 270 | 11 | ○ | ○ | 2.3 | 83 | ○ |
| | 16 | 512 | 4.3 | 82 | 2.6 | 211 | 29 | ○ | ○ | 3.0 | 78 | ○ |
| | 17 | 541 | 4.1 | 93 | 2.8 | 278 | 14 | ○ | ○ | 2.0 | 64 | ○ |
| | 18 | 518 | 4.2 | 92 | 2.6 | 236 | 20 | ○ | ○ | 2.2 | 73 | ○ |

TABLE 5

| | | | Mechanical Property | | | | The | Roundness | | | Height | State |
|---|---|---|---|---|---|---|---|---|---|---|---|---|
| Wire | | Annealing Temperature (°C.) | Fracture Elongation Percentage $E_L$ (%) | Young's modulus E (GPa) | $\sigma_{0.2}/E \times 10^{-5}$ | $\sigma_{0.2}$ (MPa) | number of contacts (Piece) | of Compression Ball | Bonding Reliability | Resin Flow (%) | of Loop (μm) | of Al pad |
| The present invention | 19 | 524 | 4.2 | 92 | 2.7 | 244 | 18 | ○ | ○ | 2.1 | 68 | ○ |
| | 20 | 527 | 4.3 | 90 | 2.5 | 227 | 18 | ○ | ○ | 2.1 | 71 | ○ |
| | 21 | 521 | 4.2 | 83 | 2.5 | 222 | 20 | ○ | ○ | 2.4 | 73 | ○ |
| | 22 | 519 | 4.3 | 88 | 2.4 | 213 | 25 | ○ | ○ | 2.3 | 72 | ○ |
| | 23 | 521 | 4.2 | 90 | 2.5 | 224 | 24 | ○ | ○ | 2.3 | 75 | ○ |
| | 24 | 509 | 4.1 | 79 | 2.3 | 182 | 32 | ○ | ○ | 3.0 | 68 | ○ |
| | 25 | 531 | 4.3 | 98 | 3.0 | 294 | 5 | ○ | ○ | 2.0 | 65 | ○ |
| | 26 | 501 | 2.0 | 100 | 2.9 | 293 | 32 | ○ | ○ | 2.0 | 73 | ○ |
| | 27 | 539 | 10.0 | 82 | 2.3 | 189 | 23 | ○ | ○ | 2.9 | 73 | ○ |
| Comparative | 1 | 520 | 4.3 | 86 | 2.5 | 219 | 18 | ○ | x | 2.1 | 72 | ○ |
| | 2 | 519 | 4.4 | 93 | 2.5 | 234 | 16 | ○ | ○ | 2.2 | 71 | x |
| | 3 | 518 | 4.0 | 88 | 2.6 | 229 | 17 | ○ | x | 2.5 | 71 | ○ |
| | 4 | 519 | 4.3 | 94 | 2.4 | 231 | 21 | ○ | ○ | 2.3 | 72 | x |
| | 5 | 519 | 4.2 | 86 | 2.5 | 213 | 25 | ○ | x | 2.1 | 74 | ○ |
| | 6 | 521 | 4.0 | 92 | 2.5 | 235 | 20 | ○ | ○ | 2.5 | 71 | x |
| | 7 | 520 | 4.1 | 90 | 2.6 | 233 | 16 | x | ○ | 2.4 | 83 | ○ |
| | 8 | 519 | 4.4 | 92 | 2.5 | 231 | 16 | ○ | ○ | 2.5 | 72 | x |

TABLE 6

| Wire | | Annealing Temperature (° C.) | Mechanical Property | | | | The number of contacts (Piece) | Roundness of Compression Ball | Bonding Reliability | Resin Flow (%) | Height of Loop (μm) | State of Al pad |
|---|---|---|---|---|---|---|---|---|---|---|---|---|
| | | | Fracture Elongation Percentage $E_L$ (%) | Young's modulus E (GPa) | $\sigma_{0.2}/E \times 10^{-5}$ | $\sigma_{0.2}$ (MPa) | | | | | | |
| Compara- | 9 | 511 | 4.4 | 74* | 2.1* | 156 | 293 | ○ | ○ | 4.8 | 87 | ○ |
| tive | 10 | 547 | 4.4 | 96 | 2.9 | 278 | 14 | ○ | ○ | 2.0 | 62 | x |
| | 11 | 506 | 4.2 | 93 | 3.0 | 277 | 11 | x | ○ | 2.0 | 38 | x |
| | 12 | 511 | 4.4 | 78 | 2.1* | 167 | 169 | ○ | ○ | 3.2 | 76 | ○ |
| | 13 | 532 | 4.1 | 96 | 2.6 | 251 | 12 | ○ | ○ | 1.9 | 62 | x |
| | 14 | 525 | 4.0 | 67 | 2.4 | 209 | 20 | ○ | ○ | 2.1 | 67 | x |
| | 15 | 521 | 4.0 | 91 | 2.5 | 230 | | Striped in Stitching Bond | | | | |
| | 16 | 505 | 4.1 | 74* | 2.1* | 158 | 288 | ○ | ○ | 4.5 | 71 | ○ |
| | 17 | 536 | 4.2 | 101 | 3.0 | 303 | 4 | ○ | ○ | 1.8 | 75 | x |
| | 18 | 502 | 4.1 | 99 | 3.0 | 297 | 248 | ○ | ○ | 2.2 | 71 | ○ |
| | 19 | 543 | 12.0* | 75 | 2.1* | 160 | 181 | ○ | ○ | 4.2 | 73 | ○ |
| The Related Art | 1 | 511 | 4.2 | 74* | 2.1* | 158 | 221 | ○ | ○ | 4.3 | 83 | ○ |

*means a value out of the range of the present invention

It can be understood from the results indicated in Tables 1 to 6 that the wires 1 to 27 according to the invention have the excellent bonding reliability, roundness of the compression ball, straightness, resin flowability resistance, and damage ability resistance of Al pad, and more particularly, with respect to the excellent bonding reliability, roundness of the compression ball, straightness, and resin flowability resistance, the comparative wires 1 to 19 and the related art wire 1 have a defect of at least one of the above-described properties.

What is claimed is:

1. A gold alloy wire for a bonding wire having high bonding reliability, high roundness of a compression ball, high straightness, and high resin flowability resistance, the gold alloy wire comprising:
   a component composition comprising at least one kind of Pt and Pd of 5000 ppm to 2% by mass in total, Ir: 1 to 200 ppm, Ca: 20 to 200 ppm, Eu: 10 to 200 ppm, and the balance being Au and inevitable impurities.

2. A gold alloy wire of claim 1, wherein:
   the component composition further comprises Be: 0.1 to 30 ppm.

3. A gold alloy wire of claim 1, wherein:
   the component composition further comprises La: 10 to 200 ppm.

4. A gold alloy wire of claim 1, wherein:
   the component composition further comprises Be: 0.1 to 30 ppm, and La: 10 to 200 ppm.

5. The gold alloy wire for the bonding wire having high bonding reliability, high roundness of the compression ball, high straightness, and high resin flowability resistance according to claim 1,
   wherein at least one kind of Ca, Eu, Be, and La are in a range of 50 to 250 ppm in total.

6. The gold alloy wire for the bonding wire having high bonding reliability, high roundness of the compression ball, high straightness, and high resin flowability resistance according to claim 1, further comprising:
   Ag: 1 to 20 ppm.

7. The gold alloy wire for the bonding wire having high bonding reliability, high roundness of the compression ball, high straightness, and high resin flowability resistance according to claim 1,
   wherein, when 0.2% proof strength (Pa) of the gold alloy wire for a bonding wire is defined as $\sigma_{0.2}$, Young's modulus (Pa) is defined as E, and fracture elongation percentage is defined as $E_L$, the following equations are satisfied $E \geq 75$ GPa;

$(\sigma_{0.2}/E) \geq 2.2 \times 10^{-3}$; and $2\% \leq E_L \leq 10\%$.

* * * * *